United States Patent
Wu et al.

(10) Patent No.: US 11,751,346 B2
(45) Date of Patent: Sep. 5, 2023

(54) ROTATING DEVICE AND DISPLAY DEVICE (71) Applicant: Yungu (Gu'an) Technology Co., Ltd., Langfang (CN)

(72) Inventors: Yuhua Wu, Langfang (CN); Qi Shan, Langfang (CN); Liwei Ding, Langfang (CN); Fu Liao, Langfang (CN); Yongfeng Zhao, Langfang (CN); Jia Liu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 480 days.

(21) Appl. No.: 16/990,113

(22) Filed: Aug. 11, 2020

(65) Prior Publication Data

US 2020/0375048 A1 Nov. 26, 2020

Related U.S. Application Data

(63) Continuation of application No. PCT/CN2019/088554, filed on May 27, 2019.

(30) Foreign Application Priority Data

Nov. 13, 2018 (CN) .......................... 201811345218.5

(51) Int. Cl.
*H05K 5/00* (2006.01)
*H05K 5/02* (2006.01)
(Continued)

(52) U.S. Cl.
CPC ............ *H05K 5/0226* (2013.01); *F16C 11/04* (2013.01); *H05K 5/0017* (2013.01); *H05K 1/148* (2013.01)

(58) Field of Classification Search
None
See application file for complete search history.

(56) References Cited

U.S. PATENT DOCUMENTS 8,358,513 B2 * 1/2013 Kim ................. H04M 1/72409
361/810
8,405,978 B2 * 3/2013 Okutsu ................ G06F 1/1643
361/679.55
(Continued)

FOREIGN PATENT DOCUMENTS

CN 101063466 A 10/2007
CN 201794417 U 4/2011
(Continued)

OTHER PUBLICATIONS

PCT International Search Report of PCT/CN2019/088554 dated Aug. 28, 2019.
(Continued)

*Primary Examiner* — Anthony Q Edwards
*Assistant Examiner* — Rashen E Morrison
(74) *Attorney, Agent, or Firm* — Ladas & Parry LLP (57) ABSTRACT

The present application discloses a rotating device and a display device, which relate to a field of electronic technologies. The rotating device includes: a first member including an anti-rotation groove and at least one first connecting portion; and a second member including an anti-rotation protrusion and at least one second connecting portion. The first connecting portion and the second connecting portion are rotationally connected, and the anti-rotation protrusion enters the anti-rotation groove to prevent the first connecting portion from rotating along a first direction with respect to the second connecting portion.

19 Claims, 6 Drawing Sheets

(51) Int. Cl.
  *F16C 11/04* (2006.01)
  *H05K 1/14* (2006.01)

(56) References Cited

U.S. PATENT DOCUMENTS

| | | | | |
|---|---|---|---|---|
| 8,670,244 B2* | 3/2014 | Wakimoto | ............ | G06F 1/1626 |
| | | | | 361/755 |
| 10,168,746 B2* | 1/2019 | Senatori | ................ | G06F 1/1616 |
| 10,416,727 B2* | 9/2019 | Lin | ........................ | G06F 1/1681 |
| 10,641,318 B2* | 5/2020 | Siddiqui | ............... | G06F 1/1616 |
| 10,694,624 B2* | 6/2020 | Rothkopf | ............... | G06F 1/1652 |
| 10,921,863 B2* | 2/2021 | Gault | .................... | H04M 1/022 |
| 11,347,275 B2* | 5/2022 | Hsu | ........................ | G06F 1/1616 |
| 11,360,519 B2* | 6/2022 | Peng | ..................... | G06F 1/1656 |
| 11,360,522 B2* | 6/2022 | Ho | ........................ | G06F 1/1681 |
| 2004/0156497 A1 | 6/2004 | Kato | | |
| 2009/0322627 A1 | 12/2009 | Sato et al. | | |
| 2012/0212924 A1* | 8/2012 | Nakajima | ............. | G06F 1/1681 |
| | | | | 361/807 |
| 2016/0054761 A1* | 2/2016 | Wolff | ..................... | E05D 13/14 |
| | | | | 361/679.09 |

FOREIGN PATENT DOCUMENTS

| | | |
|---|---|---|
| CN | 103235638 A | 6/2013 |
| CN | 203324891 U | 12/2013 |
| CN | 103161819 B | 4/2015 |
| CN | 205278701 U | 6/2016 |
| CN | 206348700 U | 7/2017 |
| CN | 206619066 U | 11/2017 |
| CN | 207051771 U | 2/2018 |
| CN | 207532108 U | 6/2018 |
| CN | 109171193 A | 1/2019 |
| CN | 109491455 A | 3/2019 |

OTHER PUBLICATIONS

PCT Written Opinion of PCT/CN2019/088554 dated Aug. 28, 2019.
Chinese First Office Action for CN Application No. 201811345218.5 dated Mar. 2, 2020.
Taiwan First Office Action for Application No. 108121045 dated Jul. 20, 2020.

* cited by examiner

ROTATING DEVICE AND DISPLAY DEVICE

CROSS-REFERENCE TO RELATED APPLICATIONS

This application is a continuation of International Application No. PCT/CN2019/088554 led on May 27, 2019, which claims priority to Chinese patent application No. 201811345218.5 fled on Nov. 13, 2018. Both applications are incorporated herein by reference in their entireties.

TECHNICAL FIELD

The present application relates to a field of electronic technologies, particularly to a rotating device and a display device.

BACKGROUND

With a development of electronic technologies, electronic products are flooding people's daily lives. However, rotational connection components of the electronic products often suffer from damage during rotation.

Therefore, how to reduce the damage of the rotational connection components during rotation have become urgent problems to be solved.

SUMMARY

In view of this, embodiments of the present application are dedicated to providing a rotating device and a display device to solve the problem that rotational connection components in the prior art is likely to be damaged during rotation.

One aspect of the present application provides a rotating device, including: a first member including an anti-rotation groove and at least one first connecting portion; and a second member including an anti-rotation protrusion and at least one second connecting portion. The at least one first connecting portion and the at least one second connecting portion are rotationally connected, and the anti-rotation protrusion enters the anti-rotation groove to prevent the at least one first connecting portion from rotating along a first direction with respect to the at least one second connecting portion.

Another aspect of the present application provides a display device, including: a first display panel, a second display panel and the rotating device according to any one of the above embodiments. The first display panel is fixedly disposed on the first member, and the second display panel is fixedly disposed on the second member.

In the embodiments of the present application, by disposing the anti-rotation protrusion and the anti-rotation groove, the anti-rotation protrusion may enter the anti-rotation groove during a relative rotation between the at least one first connecting portion and the at least one second connecting portion, so as to prevent the at least one first connecting portion from rotating in the first direction with respect to the at least one second connecting portion, thereby effectively limiting a relative rotation angle between the at least one first connecting portion and the at least one second connecting portion, and avoiding an excessive rotation between the at least one first connecting portion and the at least one second connecting portion, thus effectively reducing the damage of the rotational connection components.

DETAILED DESCRIPTION OF THE EMBODIMENTS

The technical solutions in the embodiments of the present application may be described clearly and completely in conjunction with the accompanying drawings in the embodiments of the present application.

Wherever possible, the same reference numbers may be used for the same or similar parts mentioned in the various parts of the accompanying drawings.

As described in the background, the rotational connection components in the prior art is likely to be damaged during rotation, which further causes the electronic products to fail to be used normally. The inventor discovered through research that the reasons for these problems are that there is an excessive rotation between the rotational connection components, so that an external force experienced by the rotational connection components exceeds a limit of the external force, resulting in the damage of the rotational connection components under the external force.

In order to solve the problems, if a rotation angle between the rotational connection components can be limited, the excessive rotation between the rotational connection components may be effectively avoided, thereby greatly reducing the damage of the rotational connection components.

Figure 1:
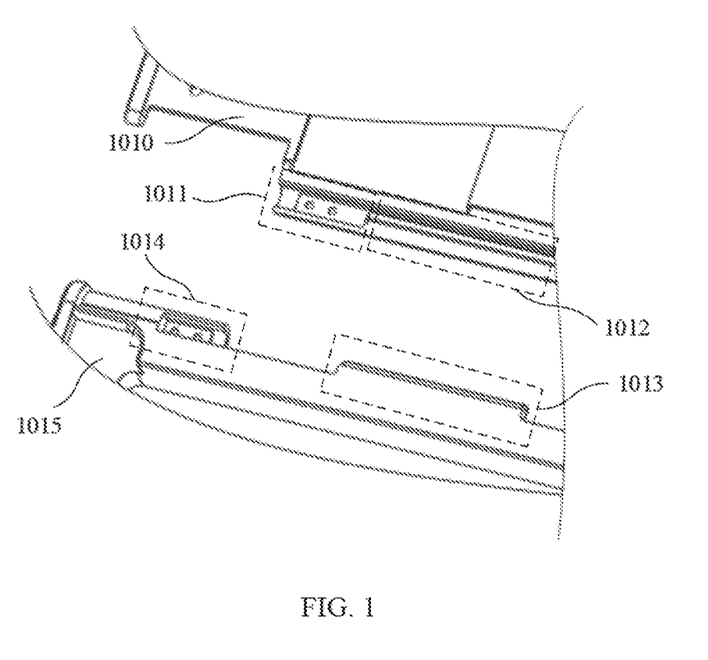
FIG. 1 is a schematic structural diagram of a rotating device according to an embodiment of the present application.

FIG. 1 is a schematic structural diagram of a rotating device according to an embodiment of the present application.

As shown in FIG. 1, the rotating device may include: a first member 1010 including an anti-rotation groove 1012 and a first connecting portion 1011; and a second member 1015 including an anti-rotation protrusion 1013 and a second connecting portion 1014. The first connecting portion 1011 and the second connecting portion 1014 are rotationally connected, and the anti-rotation protrusion 1013 enters the anti-rotation groove 1012 to prevent the first connecting portion 1011 from rotating along a first direction with respect to the second connecting portion 1014. The first direction is a direction of rotating from the first connecting portion 1011 to the second connecting portion 1014.

Specifically, the anti-rotation groove 1012 and the first connecting portion 1011 may be disposed on the first member 1010, and the anti-rotation protrusion 1013 and the second connecting portion 1014 may be disposed on the second member 1015. The first member 1010 and the second member 1015 may achieve a mutual rotation with each other by a rotational connection between the first connecting portion 1011 and the second connecting portion 1014.

During mutual rotation, the anti-rotation groove 1012 may rotate with the first connecting portion 1011, and the anti-rotation protrusion 1013 may rotate with the second connecting portion 1014. After the anti-rotation protrusion 1013 enters the anti-rotation groove 1012, since a relative rotation between the anti-rotation protrusion 1013 and the anti-rotation groove 1012 can no longer occur in an original rotation direction, a relative rotation between the first connecting portion 1011 and the second connecting portion 1014 may also be limited.

In the embodiments of the present application, by providing the anti-rotation protrusion 1013 and the anti-rotation groove 1012, the anti-rotation protrusion 1013 may enter the anti-rotation groove 1012 during the relative rotation between the first connecting portion and the second connecting portion, so as to prevent the first connecting portion 1011 from rotating in the first direction with respect to the second connecting portion 1014, thereby effectively limiting a relative rotation angle between the first connecting portion 1011 and the second connecting portion 1014, and avoiding an excessive rotation between the first connecting portion 1011 and the second connecting portion 1014, thus effectively reducing the damage of the rotational connection components.

Figure 2:
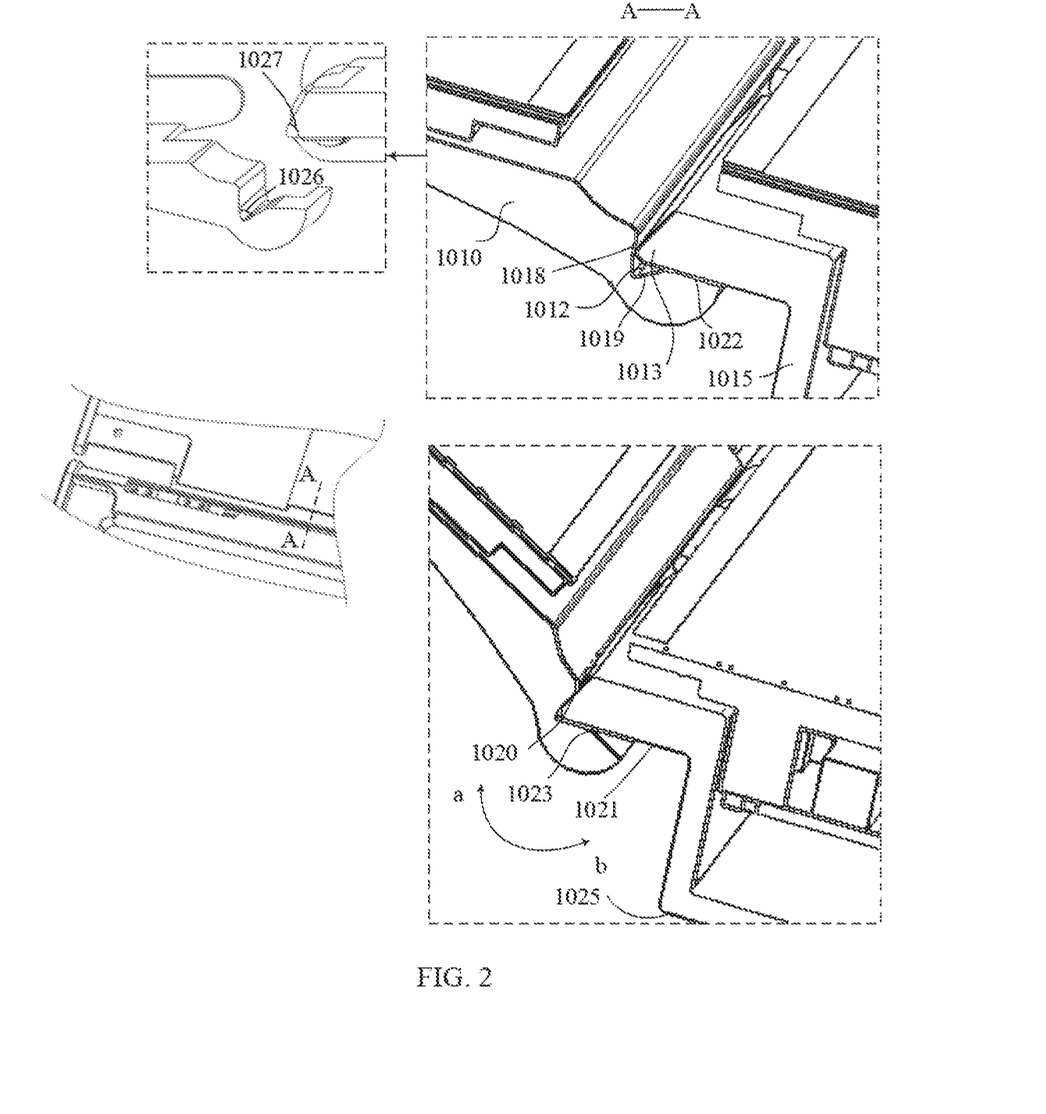
FIG. 2 is a schematic cross-sectional view of an A-A position of a rotating device according to an embodiment of the present application.

FIG. 2 is a schematic cross-sectional view of an A-A position of a rotating device according to an embodiment of the present application. In FIG. 2, two states involving the A-A position are respectively in a case where the anti-rotation protrusion 1013 does not enter the anti-rotation groove 1012 and in another case where the anti-rotation protrusion 1013 completely enters the anti-rotation groove 1012.

In an embodiment of the present application, as shown in FIG. 2, the anti-rotation groove 1012 may include a first inner surface 1018 and a second inner surface 1019 forming first sharp corner 1026, and the anti-rotation protrusion 1013 may include a first outer surface 1020 and a second outer surface 1021 forming a second sharp corner 1027. An angle of the first sharp corner 1026 is equal to that of the second sharp corner 1027.

Specifically, across section of the anti-rotation groove 1012 may be in a shape of sharp angle, and the sharp angle may be referred to as the first sharp corner 1026. Two sides of the first sharp corner 1026 may be defined by the first inner surface 1018 and the second inner surface 1019 of the anti-rotation groove 1012. Similarly, a cross section of the anti-rotation protrusion 1013 may also be in a shape of sharp angle, and the sharp angle may be referred to as the second sharp corner 1027. Two sides of the second sharp corner 1027 may be defined by the first outer surface 1020 and the second outer surface 1021 of the anti-rotation protrusion 1013. In order to ensure that the anti-rotation protrusion 1013 can prevent the first connecting portion 1011 from rotating in the first direction with respect to the second connecting portion 1014 after the anti-rotation protrusion 1013 enters the anti-rotation groove 1012, the angle of the first sharp corner 1026 is equal to that of the second sharp corner 1027.

Correspondingly, the shape of the anti-rotation groove 1012 and the anti-rotation protrusion 1013 is set to be in a sharp angle. When the first connecting portion 1011 and the second connecting portion 1014 are relatively rotated, the anti-rotation protrusion 1013 may be inserted into the anti-rotation groove 1012 along an inner surface of the anti-rotation groove 1012, which is convenient and quick.

In an embodiment of the present application, in order to facilitate a relative rotation between the first member 1010 and the second member 1015, components for achieving the relative rotation between the first member 1010 and the second member 1015 may be respectively disposed in edges of the first member 1010 and the second member 1015. i.e., the first connecting portion 1011 and the second connecting portion 1014 may be respectively disposed at the edges of the first member 1010 and the second member 1015. Further, in order to ensure that the first member 1010 and the second member 1015 may be in a flat state and do not affect a flatness of a plane when relatively rotated, the first connecting portion 1011 and the second connecting portion 1014 may be preferably respectively disposed on a side surface of the first member 1010 and a side surface of the second member 1015. Specifically, as shown in FIG. 1, the anti-rotation groove 1012 and the first connecting portion 1011 may be disposed on one side surface of the first member 1010, and the anti-rotation protrusion 1013 and the second connecting portion 1014 may be disposed on one side surface of the second member 1015.

Figure 3:
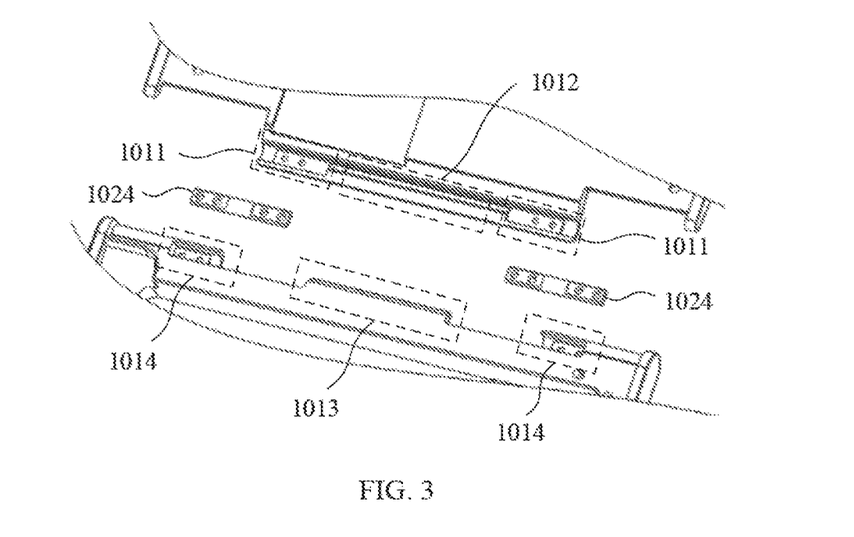
FIG. 3 is a schematic structural diagram of a rotating device according to another embodiment of the present application.

FIG. 3 is a schematic structural diagram of a rotating device according to another embodiment of the present application.

In an embodiment of the present application, the rotating device include one group of the first connecting portion 1011 and the second connecting portion 1014. During rotation, the first member 1010 and the second member 1015 are susceptible to damage due to a localized concentrated force. For example, the first connecting portion 1011 breaks from the first member 1010, and/or the second connecting portion 1014 breaks from the second member 1015. Therefore, as shown in FIG. 3, the number of groups of the first connecting portion 1011 and the second connecting portion 1014 included in the rotating device may be preferably two, and each group includes one first connecting portion 1011 and one second connecting portion 1014. In order to make an anti-rotation force between the anti-rotation protrusion 1013 and the anti-rotation groove 1012 may quickly and effectively act on the two groups of the first connecting portions 1011 and the second connecting portions 1014, the anti-rotation protrusion 1013 may be preferably disposed between two second connecting portions 1014, and correspondingly, the anti-rotation groove 1012 is disposed between two first connecting portions 1011.

In an embodiment of the present application, as shown in FIG. 3, the anti-rotation groove 1012 and the two first connecting portions 1011 may be preferably integrally formed.

Specifically, integrally formed may mean that the anti-rotation groove 1012 and the two first connecting portions 1011 are physically connected to each other, and there is no interval between the anti-rotation groove 1012 and the two first connecting portions 1011. For example, during preparation, the anti-rotation groove 1012 and the two first connecting portions 1011 may be respectively prepared on one protrusion on a side surface of the first member 1010.

Correspondingly, in a case where the anti-rotation groove 1012 and the anti-rotation protrusion 1013 prevent the first connecting portion 1011 and the second connecting portion 1014 from rotating relative to each other, the integrally formed structure may enable the anti-rotation force between the anti-rotation groove 1012 and the anti-rotation protrusion 1013 directly transmitted to the first connecting portion 1011, thereby limiting the relative rotation between the first connecting portion 1011 and the second connecting portion 1014.

In an embodiment of the present application, as shown in FIG. 2 and FIG. 3, in order to allow the first connecting portion 1011 and the second connecting portion 1014 to be fully rotatable within a range of the relative rotation, the first connecting portion 1011 and the second connecting portion 1014 may preferably realize the rotational connection by a hinge 1024.

Specifically, the hinge 1024 may be selected to be in a shape of straight line segment. Correspondingly, the first connecting portion 1011 and the second connecting portion 1014 may be coaxially disposed, and respectively fixed at opposite ends of the hinge 1024 in a shape of straight line segment.

In an embodiment of the present application, the second outer surface 1021 of the anti-rotation protrusion 1013 is in contact with the third outer surface 1022 of the anti-rotation groove 1012 to prevent the first connecting portion 1011 from rotating in a second direction opposite to the first direction with respect to the second connecting portion 1014.

Specifically, as shown in FIG. 2, the relative rotation between the first connecting portion 1011 and the second connecting portion 1014 may be in an a direction, or may be in a b direction opposite to the a direction. In a case where the first connecting portion 1011 and the second connecting portion 1014 are relatively rotated in the a direction, the anti-rotation protrusion 1013 may enter the anti-rotation groove 1012, which further restricts the relative rotation between the first connecting portion 1011 and the second connecting portion 1014 in the a direction. If the first connecting portion 1011 and the second connecting portion 1014 are relatively rotated in the b direction, the anti-rotation protrusion 1013 may be separated from the anti-rotation groove 1012, and the third outer surface 1022 of the anti-rotation groove 1012 and the second outer surface 1021 of the anti-rotation protrusion 1013 may approach each other. In a case where the third outer surface 1022 and the second outer surface 1021 are in contact with each other, the relative rotation between the first connecting portion 1011 and the second connecting portion 1014 in the b direction may be restricted. As a result, the limitation of an angular range of the relative rotation between the first connecting portion 1011 and the second connecting portion 1014 may be realized. In this embodiment, the a direction is the first direction, and the b direction is the second direction.

In an embodiment of the present application, as shown in FIG. 2, the third outer surface 1022 may be disposed at a periphery of the second sharp corner 1027 of the anti-rotation groove 1012. In an event that the relative rotation between the first connecting portion 1011 and the second connecting portion 1014 in the b direction occurs, and in order to allow the third outer surface 1022 and the second outer surface 1021 to be in contact with each other, the second inner surface 1019 and the third outer surface 1022 of the anti-rotation groove 1012 should be intersected at a central axis 1023 of the rotational connection between the first connecting portion 1011 and the second connecting portion 1014.

Correspondingly, a maximum angle between the second outer surface 1021 of the anti-rotation protrusion 1013 and the third outer surface 1022 of the anti-rotation groove 1012 is a maximum value of an angle range at which the relative rotation may occur between the first connecting portion 1011 and the second connecting portion 1014.

In an embodiment of the present application, as shown in FIG. 2, in order to enable the first member 1010 and the second member 1015 to assume a flat state, the second outer surface 1021 of the anti-rotation protrusion 1013 may be parallel to a bottom surface 1025 of the second member 1015. In order to make the flat state as a limit state at which the relative rotation may occur between the first connecting portion 1011 and the second connecting portion 1014, in the flat state, the third outer surface 1022 of the anti-rotation groove 1012 and the second outer surface 1021 of the anti-rotation protrusion 1013 may contact each other.

The rotating device according to the embodiments of the present application is described above, and a display device according to the embodiments of the present application is described below.

The display device may include: a first display panel, a second display panel and the rotating device according to any one of the above embodiments. The first display panel is fixedly disposed on the first member 1010, and the second display panel is fixedly disposed on the second member 1015.

Specifically, as for the first display panel and the second display panel that need to realize a rotating function in the display device, they may be fixedly disposed on the first member 1010 and the second member 1015 to achieve a mutual rotation. The specific structure of the rotating device may refer to the above embodiments. In order to avoid repetition, it will not be repeated here.

In the embodiments of the present application, by providing the anti-rotation protrusion 1013 and the anti-rotation groove 1012, the anti-rotation protrusion 1013 may enter the anti-rotation groove 1012 during a relative rotation between the first connecting portion and the second connecting portion, so as to prevent the first connecting portion 1011 from rotating in a first direction with respect to the second connecting portion 1014, thereby effectively limiting a relative rotation angle between the first connecting portion 1011 and the second connecting portion 1014, and avoiding an excessive rotation between the first connecting portion 1011 and the second connecting portion 1014, thus effectively reducing the damage of rotational connection components.

A specific display device may be described below with reference to FIG. 4 to FIG. 9. In the following, a first fixed panel 22 is the first member 1010, a second fixed panel 32 is the second member 1015, and the first fixed panel 22 and the second fixed panel 32 that are rotationally connected is the rotating device.

Figure 4:
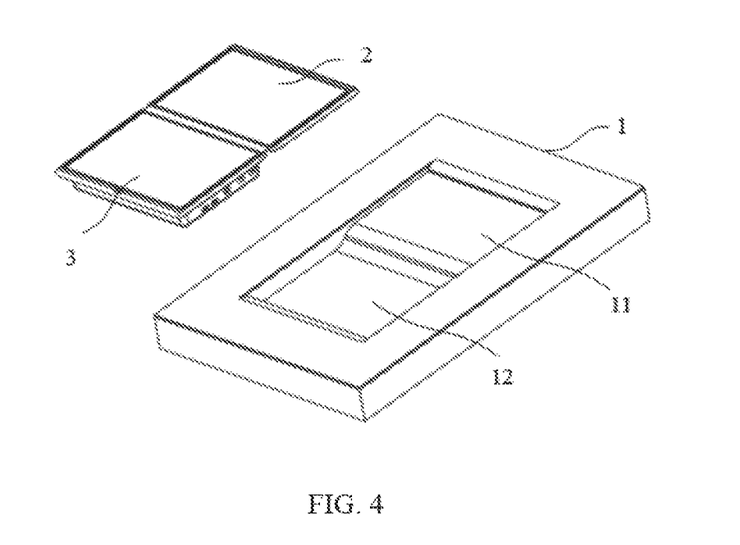
FIG. 4 is a schematic structural diagram of a display device according to an embodiment of the present application.
Figure 5:
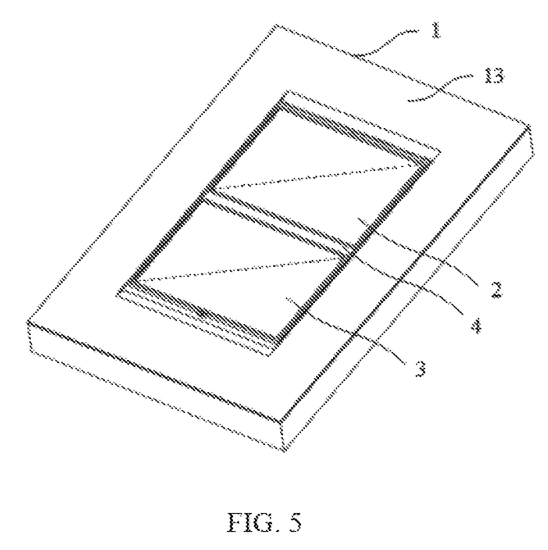
FIG. 5 is a schematic diagram of a first display screen in a flat state according to an embodiment of the present application.
Figure 6:
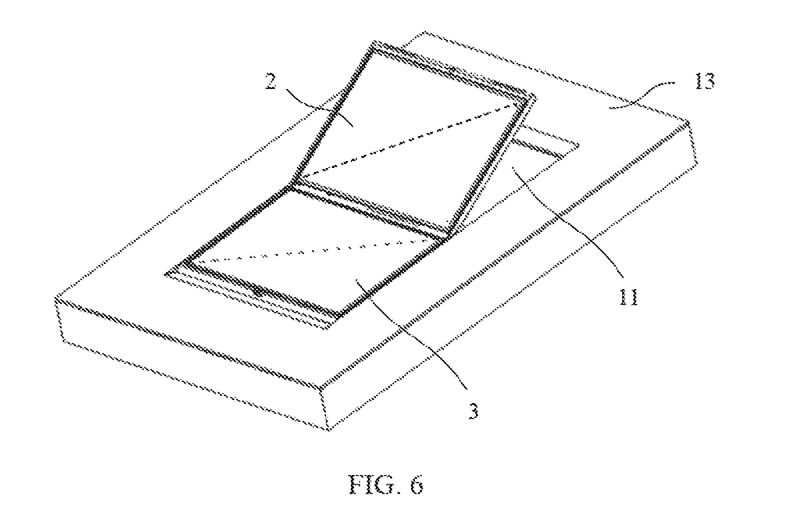
FIG. 6 is a schematic diagram of a first display screen in a folded state according to an embodiment of the present application.

FIG. 4 is a schematic structural diagram of a display device according to an embodiment of the present application. FIG. 5 is a schematic diagram of a first display screen 2 in a flat state according to an embodiment of the present application. FIG. 6 is a schematic diagram of a first display screen 2 in a folded state according to an embodiment of the present application.

As shown in FIG. 4, the display device may include: a supporting base 1 including a first groove 11 and a second groove 12; a first display screen 2 accommodated in the first groove 11; and a second display screen 3 accommodated in the second groove 12. The first display screen 2 and the second display screen 3 are rotationally connected.

In an embodiment of the present application, in a direction perpendicular to a surface 13 on which the first groove 11 and the second groove 12 are located, a distance from a bottom surface of the second groove 12 to the surface 13 is greater than a distance from a bottom surface of the first groove 11 to the surface 13, so that a thickness of the first display screen 2 may be smaller than a thickness of the second display screen 3, thereby facilitating the rotation of the first display screen 2 with respect to the second display screen 3.

Specifically, as shown in FIG. 5, in a case where the first display screen 2 and the second display screen 3 are in the flat state, i.e., when an orientation of a display region of the first display screen 2 and an orientation of a display region of the second display screen 3 are the same, the first display screen 2 may be in the first groove 11, and the second display screen 3 may be in the second groove 12. In order to make the second display screen 3 in the second groove 12, the first display screen 2 may rotate with respect to the second display screen 3. As shown in FIG. 4, the first groove 11 and the second groove 12 may connect with each other.

In order to avoid an unintentional movement of the second display screen 3 in the second groove 12, the second display screen 3 may be fixed in the second groove 12. Correspondingly, in a case where the second display screen 3 needs to be moved, the second display screen 3 may be taken out of the second groove 12 again. Therefore, a relationship between the second display screen 3 and the second groove 12 may be detachably fixed.

Since the first display screen 2 and the second display screen 3 are rotationally connected, i.e., in a case where the second display screen 3 is fixed in the second groove 12, the first display screen 2 and the first groove 11 may not move relatively, and therefore, the first groove 11 may preferably directly serve as an accommodating space of the first display screen 2.

As for the supporting base 1, it may specifically refer to a table board of a table, for example, a conference table, a desk table, a study table, etc. The surface 13 on which the first groove 11 and the second groove 12, disposed on the supporting base 1, are located may be an entire desktop. Correspondingly, according to the different functions of the table, a number of pairs of the first groove 11 and the second groove 12 disposed on the desktop may exceed one.

The supporting base 1 may also refer to a part of the table, i.e., the table board of the table may include a groove, the supporting base 1 may be directly placed in the groove to make the table have display functions. The surface 13 on which the first groove 11 and the second groove 12, disposed on the supporting base 1, are located may be a part of the desktop. Correspondingly, according to the different functions of the table, the number of grooves on the table used to place the supporting base 1 may also exceed one.

Here, as shown in FIG. 5, in a case where the first display screen 2 is in the first groove 11 and the second display screen 3 is in the second groove 12, the surface 13 on which the first groove 11 and the second groove 12, disposed on the supporting base 1, are located may be used as the desktop, and there is no problem that the display screen occupies desktop area. In a case where the first display screen 2 is rotated to fold the first display screen 2 from the first groove 11, as shown in FIG. 6, the display functions may be realized by viewing the first display screen 2 and the second display screen 3.

In the embodiments of the present application, the surface 13 on which the first groove 11 and the second groove 12, disposed on the supporting base 1, are located is used as the desktop, so that in a case where the display functions are not needed, the first display screen 2 is placed in the first groove 11, and the second display screen 3 is placed in the second groove 12; and in another case where the display functions needs to be used, the first display screen 2 is folded from the first groove 11, thereby effectively avoiding the problems of insufficient desktop available area due to the large amount of desktop area occupied by the display screen.

In an embodiment of the present application, as shown in FIG. 5, in a case where the first display screen 2 is in the first groove 11 and the second display screen 3 is in the second groove 12, and in order to make a surface on which the display region of the first display screen 2 and the second display screen 3 are located can be flush with the surface 13 on which the first groove 11 and the second groove 12, disposed on the supporting base 1, are located, in the direction perpendicular to the surface 13 on which the first groove 11 and the second groove 12 are located, a maximum size from the first groove 11 to the surface 13 may be equal to a maximum size of the first display screen 2, and a maximum size from the second groove 12 to the surface 13 may be equal to a maximum size of the second display screen 3, thus ensuring the flatness of the desktop. In other words, the first groove 11 can just accommodate the first display screen 2, and the second groove 12 can just accommodate the second display screen 3.

Figure 7:
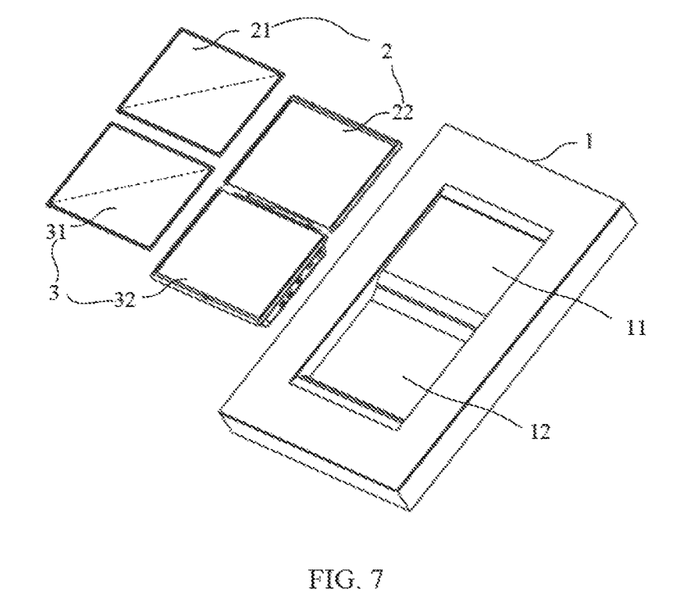
FIG. 7 is an exploded schematic view of some components according to an embodiment of the present application.

FIG. 7 is an exploded schematic view of some components according to an embodiment of the present application.

In an embodiment of the present application, as shown in FIG. 7, the first display screen 2 may include a first display panel 21 and a first fixed panel 22. The first display panel 21 is fixedly disposed on the first fixed panel 22. The second display screen 3 may include a second display panel 31 and a second fixed panel 32. The second display panel 31 is fixedly disposed on the second fixed panel 32. The rotational connection between the first display screen 2 and the second display screen 3 may be realized by a hinge between the first fixed panel 22 and the second fixed panel 32.

Figure 8:
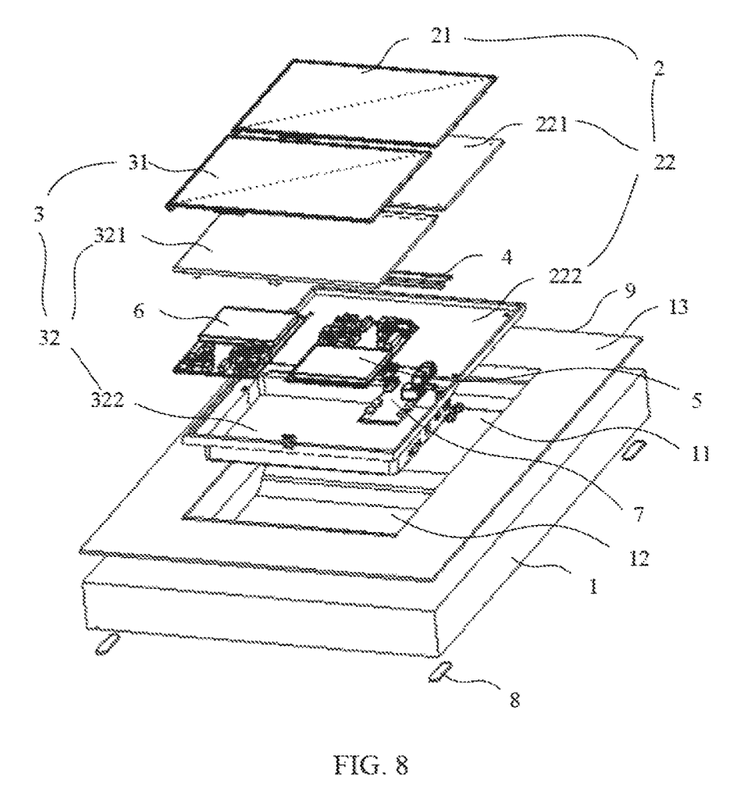
FIG. 8 is an exploded schematic view of all components according to an embodiment of the present application.

FIG. 8 is an exploded schematic view of all components according to an embodiment of the present application.

In an embodiment of the present application, as shown in FIG. 8, the second fixed panel 32 may include a top cover and a back cover. A first circuit board 5 of the first display screen 2, a second circuit board 6 of the second display screen 3, and an interface circuit board 7 are accommodated between the top cover and the back cover. The first circuit board 5 and the second circuit board 6 are respectively electrically connected to the interface circuit board 7. Specifically, the first circuit board 5 and the second circuit board 6 may be electrically connected to the interface circuit board 7 by a flexible printed circuit (FPC).

Specifically, in order to achieve a lightening and thinning of the first display screen 2 and/or the second display screen 3, the first fixed panel 22 and the second fixed panel 32 may both be composed of the top cover and the back cover. In order to distinguish the top cover and the back cover of the first fixed panel 22 from the top cover and the back cover of the second fixed panel 32, the top cover and the back cover of the first fixed panel 22 may be referred to as a first top cover 221 and a first back cover 222, and the top cover and the back cover of the second fixing panel 32 may be referred to as a second top cover 321 and a second back cover 322. In order to facilitate the rotation and folding of the first display screen 2, an accommodating space formed by the second top cover 321 and the second back cover 322 may be used to accommodate the first circuit board 5, the second circuit board 6, the interface circuit board 7, the FPC used to realize the electrical connection, and the like, and an accommodating space formed by the first top cover 221 and the first back cover 222 may be used to accommodate the FPC that realizes the electrical connection between the first display panel 21 and the first circuit board 5. Specifically, in order to reasonably use the accommodating space formed by the second top cover 321 and the second back cover 322, the first circuit board 5, the second circuit board 6, and the interface circuit board 7 may be fixed flatly or partially stacked.

An interface disposed on the interface circuit board 7 may include a USB interface, a charging interface, a headphone interface, a microphone interface, a network cable interface, etc. In addition, the interface may also include buttons, such as a volume button and a switch button.

In an embodiment of the present application, in order to ensure a region hardness of the supporting base 1 as the desktop, the display device may further include a cover 9, and the cover 9 may be fixed on the supporting base 1. In order to make the first groove 11 and the second groove 12 visible, the cover 9 is also disposed with an opening matching the first groove 11 and the second groove 12.

As for the case where the display device includes the cover 9, the surface 13 on which the first groove 11 and the second groove 12, disposed on the supporting base 1, are located herein may refer to a surface of the cover 9.

In an embodiment of the present application, as shown in FIG. 5, in a case where both the first display screen 2 and the second display screen 3 are in the flat state in the corresponding grooves, and in order to avoid affecting the flatness of the desktop due to a gap between the first display panel 21 and the second display panel 31, the display device may further include a soft glue 4 corresponding to the gap between the first display panel 21 and the second display panel 31. In a case where the first display screen 2 is in the flat state, the soft glue 4 may be in a stretched and flat state; and in a case where the first display screen 2 is in the folded state, the soft glue 4 may be in a natural state.

In an embodiment of the present application, in order to facilitate the fixing of the display panel, the first display panel 21 may be fixed on the first fixed panel 22 and/or the second display panel 31 may be fixed on the second fixed panel 32 by a double-sided tape.

In an embodiment of the present application, the first display panel 21 has a touch function and/or the second display panel 31 has a touch function.

Specifically, the first display panel 21 and/or the second display panel 31 have the touch function, which may be used to modify, draw, or record in real time, thereby facilitating information processing. In addition, it also avoids the problems of poor desktop cleanliness caused by keyboard and mouse settings. Furthermore, it saves papers.

Figure 9:
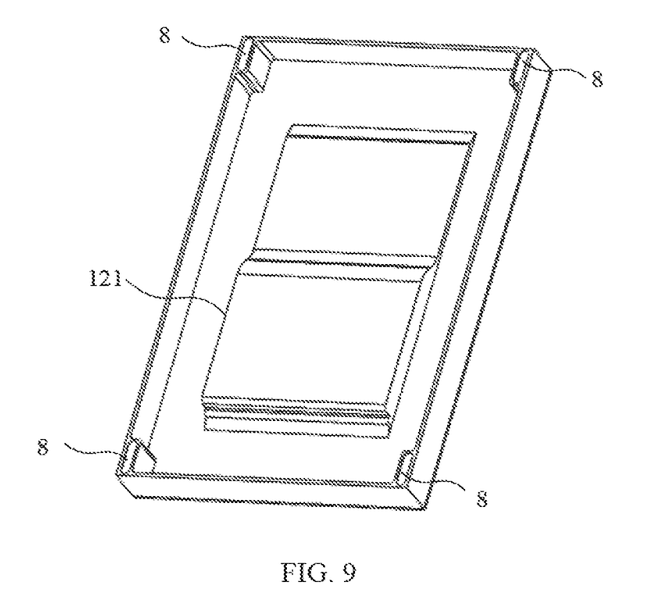
FIG. 9 is a schematic structural diagram of display equipment according to another embodiment of the present application.

FIG. 9 is a schematic structural diagram of display equipment according to another embodiment of the present application.

In an embodiment of the present application, as shown in FIG. 9, the supporting base 1 may be a hollow body without a bottom surface. At this time, a side wall 121 of the second groove 12 may be disposed with openings corresponding to the various interfaces and buttons of the interface circuit board 7, so that a user may insert an external device or press the buttons under the supporting base 1 to control the corresponding functions of the first display screen 2 and the second display screen 3 without affecting the flatness of the desktop.

In an embodiment of the present application, as shown in FIG. 9, in a case where the supporting base 1 is a part of the table, in order to avoid an unintentional sliding in a case where the supporting base 1 is placed in the groove of the table, the display device may further include a foot pad 8 at a bottom of the supporting base 1.

In an embodiment of the present application, a rotation angle of the first fixed panel 22 with respect to the second fixed panel 32 may be greater than or equal to 0° and less than or equal to 30°. Within this rotation range, the user may rotate the first fixed panel 22 according to personal habits, so that the first display panel presents the most comfortable viewing angle.

The above are only preferred embodiments of the present application and are not intended to limit the present application. Any modification, equivalent replacement, etc. made within the spirit and principle of the present application should be included in the protection scope of the present application.

What is claimed is:

1. A rotating device, comprising:
   a first member comprising an anti-rotation groove and at least one first connecting portion; and
   a second member comprising an anti-rotation protrusion and at least one second connecting portion,
   wherein the anti-rotation groove comprises a first inner surface and a second inner surface forming a first sharp corner, the anti-rotation protrusion comprises a first outer surface, a second outer surface and a third outer surface, the first outer surface and the second outer surface forms a second sharp corner, and the third outer surface is located at a periphery of the second sharp corner,
   an angle of the first sharp corner is equal to that of the second sharp corner, and the second inner surface and the third outer surface are intersected at a central axis of the rotational connection, and
   the at least one first connecting portion and the at least one second connecting portion are rotationally connected, and the anti-rotation protrusion enters the anti-rotation groove, such that the second outer surface of the anti-rotation protrusion is in contact with the third outer surface of the anti-rotation groove to prevent the at least one first connecting portion from rotating in a second direction opposite to the first direction with respect to the at least one second connecting portion.

2. The rotating device according to claim 1, wherein the second outer surface is parallel to a bottom surface of the second member.

3. The rotating device according to claim 2, wherein a rotation angle of the first member and the second member is greater than or equal to 0° and less than or equal to 30°.

4. The rotating device according to claim 1, wherein the anti-rotation groove and the at least one first connecting portion are disposed on a side surface of the first member, and the anti-rotation protrusion and the at least one second connecting portion are disposed on a side surface of the second member.

5. The rotating device according to claim 4, wherein the at least one first connecting portion comprises two first connecting portions, the at least one second connecting portion comprises two second connecting portions, and the anti-rotation protrusion is disposed between two second connecting portions.

6. The rotating device according to claim 5, wherein the anti-rotation groove and two first connection portions are integrally formed.

7. The rotating device according to claim 1, wherein the at least one first connecting portion and the at least one second connecting portion realize the rotational connection by a hinge.

8. The rotating device according to claim 7, wherein the at least one first connecting portion and the at least one second connecting portion are coaxially disposed and respectively fixed at opposite ends of the hinge.

9. A display device, comprising:
a first display panel, a second display panel and a rotating device comprising a first member comprising an anti-rotation groove and at least one first connecting portion; and
a second member comprising an anti-rotation protrusion and at least one second connecting portion,
wherein the anti-rotation groove comprises a first inner surface and a second inner surface forming a first sharp corner, the anti-rotation protrusion comprises a first outer surface, a second outer surface and a third outer surface, the first outer surface and the second outer surface forms a second sharp corner, and the third outer surface is located at a periphery of the second sharp corner,
an angle of the first sharp corner is equal to that of the second sharp corner, and the second inner surface and the third outer surface are intersected at a central axis of the rotational connection,
the at least one first connecting portion and the at least one second connecting portion are rotationally connected, and the anti-rotation protrusion enters the anti-rotation groove, such that the second outer surface of the anti-rotation protrusion is in contact with the third outer surface of the anti-rotation groove to prevent the at least one first connecting portion from rotating in a second direction opposite to the first direction with respect to the at least one second connecting portion, and
the first display panel is fixedly disposed on the first member, and the second display panel is fixedly disposed on the second member.

10. The display device according to claim 9, further comprising:
a supporting base;
wherein the supporting base comprises a first groove and a second groove, and the first member is accommodated in the first groove and the second member is accommodated in the second groove.

11. The display device according to claim 10, further comprising:
a first display screen and a second display screen;
wherein the first display screen comprises the first display panel and the first member, the second display screen comprises the second display panel and the second member, and the supporting base comprises a surface disposed with the first groove and the second groove; wherein
in a direction perpendicular to the surface on which the first groove and the second groove are located, a maximum dimension from the first groove to the surface is equal to a maximum dimension of the first display screen, and a maximum dimension from the second groove to the surface is equal to a maximum dimension of the second display screen.

12. The display device according to claim 9, further comprising:
a first display screen and a second display screen;
wherein the first display screen comprises the first display panel, the first member and a first circuit board, the second display screen comprises the second display panel, the second member and a second circuit board, and the second member comprises a top cover and a back cover; and
the first circuit board, the second circuit board and an interface circuit board are accommodated between the top cover and the back cover, and the first circuit board and the second circuit board are respectively electrically connected to the interface circuit board.

13. The display device according to claim 9, further comprising:
a soft glue corresponding to a gap between the first display panel and the second display panel.

14. The display device according to claim 9, wherein a rotation angle of the first member and the second member is greater than or equal to 0° and less than or equal to 30°.

15. A rotating device, comprising:
a first member comprising an anti-rotation groove and at least one first connecting portion, wherein the anti-rotation groove comprises a first inner surface and a second inner surface forming a first sharp corner; and
a second member comprising an anti-rotation protrusion and at least one second connecting portion, the anti-rotation protrusion comprises a first outer surface and a second outer surface forming a second sharp corner, and an angle of the first sharp corner is equal to that of the second sharp corner,
wherein the at least one first connecting portion and the at least one second connecting portion are rotationally connected, and the anti-rotation protrusion enters the anti-rotation groove to prevent the at least one first connecting portion from rotating along a first direction, from the at least one first connecting portion to the at least one second connecting portion, with respect to the at least one second connecting portion.

16. The rotating device according to claim 15, wherein the anti-rotation groove further comprises a third outer surface located at a periphery of the second sharp corner, and the second inner surface and the third outer surface are intersected at a central axis of the rotational connection.

17. The rotating device according to claim 16, wherein
the second outer surface of the anti-rotation protrusion is in contact with the third outer surface of the anti-rotation groove to prevent the at least one first connecting portion from rotating in a second direction opposite to the first direction with respect to the at least one second connecting portion, and
the second outer surface is parallel to a bottom surface of the second member.

18. The rotating device according to claim 15, wherein the anti-rotation groove and the at least one first connecting portion are disposed on a side surface of the first member, and the anti-rotation protrusion and the at least one second connecting portion are disposed on a side surface of the second member,
the at least one first connecting portion comprises two first connecting portions, the at least one second connecting portion comprises two second connecting portions, and the anti-rotation protrusion is disposed between two second connecting portions, and
the anti-rotation groove and two first connection portions are integrally formed.

19. The rotating device according to claim 15, wherein the at least one first connecting portion and the at least one second connecting portion realize the rotational connection by a hinge, and the at least one first connecting portion and the at least one second connecting portion are coaxially disposed and respectively fixed at opposite ends of the hinge.

* * * * *